(12) United States Patent
Horstmann et al.

(10) Patent No.: US 9,039,872 B2
(45) Date of Patent: May 26, 2015

(54) METHOD FOR PRODUCING A TRANSPARENT AND CONDUCTIVE METAL OXIDE LAYER BY HIGHLY IONIZED PULSED MAGNETRON SPUTTERING

(75) Inventors: Felix Horstmann, Braunschweig (DE); Volker Sittinger, Braunschweig (DE); Bernd Szyszka, Braunschweig (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 762 days.

(21) Appl. No.: 12/997,712

(22) PCT Filed: Jun. 9, 2009

(86) PCT No.: PCT/EP2009/004115
§ 371 (c)(1),
(2), (4) Date: Mar. 8, 2011

(87) PCT Pub. No.: WO2009/149888
PCT Pub. Date: Dec. 17, 2009

(65) Prior Publication Data
US 2011/0168547 A1  Jul. 14, 2011

(30) Foreign Application Priority Data

Jun. 13, 2008 (DE) .......................... 10 2008 028 140

(51) Int. Cl.
*C23C 14/34* (2006.01)
*C23C 14/58* (2006.01)
(Continued)

(52) U.S. Cl.
CPC .......... *C23C 14/5806* (2013.01); *C23C 14/3492* (2013.01); *C23C 14/086* (2013.01); *C23C 14/3485* (2013.01); *C23C 14/35* (2013.01); *H01J 37/3467* (2013.01)

(58) Field of Classification Search
CPC .......................... C23C 14/3485; C23C 14/3492

USPC ........................................................ 204/298.2
See application file for complete search history.

(56) References Cited

U.S. PATENT DOCUMENTS 4,737,379 A * 4/1988 Hudgens et al. .............. 427/575
6,582,839 B1 * 6/2003 Yamamoto et al. ........... 428/702
(Continued)

FOREIGN PATENT DOCUMENTS

DE  10 2006 021 994 A1  11/2007
DE  10 2006 046 312 A1   4/2008
(Continued)

OTHER PUBLICATIONS

Sittinger, et al. "High Power Pulsed Magnetron Sputtering of Transparent Conducting Oxides", Thin Solid Films, 5th International Symposium on Transparent Oxide Thin Films for Electronics and Optics, Oct. 16, 2007, pp. 5847-5859, vol. 516, No. 17, Elsevier-Sequoia S.A., Lausanne, CH (URL: "doi:10.1016/j.physletb.2003.10.071") Abstract provided.
(Continued)

*Primary Examiner* — Keith Hendricks
*Assistant Examiner* — Timon Wanga
(74) *Attorney, Agent, or Firm* — Laurence A. Greenberg; Werner H. Stemer; Ralph E. Locher

(57) ABSTRACT

A method for producing a transparent and conductive metal oxide layer on a substrate, includes atomizing at least one component of the metal oxide layer by highly ionized, high power pulsed magnetron sputtering to condense on the substrate. The pulses of the magnetron have a peak power density of more than $1.5\ kW/cm^2$, the pulses of the magnetron have a duration of $\leq 200\ \mu s$, and the average increase in current density during ignition of the plasma within an interval, which is $\leq 0.025\ ms$, is at least $106\ A/(ms\ cm^2)$.

18 Claims, 2 Drawing Sheets

(51) Int. Cl.
*C23C 14/08* (2006.01)
*C23C 14/35* (2006.01)
*H01J 37/34* (2006.01)

(56) References Cited

U.S. PATENT DOCUMENTS

| | | | |
|---|---|---|---|
| 8,173,278 | B2 | 5/2012 | Cremer |
| 2004/0124077 | A1* | 7/2004 | Christie .................. 204/192.12 |
| 2006/0175197 | A1* | 8/2006 | Chistyakov ................ 204/298.2 |
| 2006/0278518 | A1* | 12/2006 | Kouznetsov ............... 204/192.1 |
| 2007/0209928 | A1 | 9/2007 | Inoue et al. |
| 2007/0275252 | A1* | 11/2007 | Krasnov ....................... 428/432 |
| 2010/0006426 | A1 | 1/2010 | Sittinger et al. |
| 2010/0092771 | A1 | 4/2010 | Decroupet et al. |

FOREIGN PATENT DOCUMENTS

| | | | |
|---|---|---|---|
| EP | 1 731 629 | A1 | 12/2006 |
| EP | 1 936 008 | A1 | 6/2008 |
| WO | 2007121954 | A1 | 11/2007 |
| WO | 2008040502 | A1 | 4/2008 |

OTHER PUBLICATIONS

D. J. Christie, "Target material pathways model for high power pulsed magnetron sputtering" J. Vac. Sci. Technol. A23(2), Mar./Apr. 2005, pp. 330-335.

V. Sittinger et al., "Deposition of High Conductivity ITO Films by High Power Pulsed Magnetron Sputtering (HPPMS)", 2006 Society of Vacuum Coaters, 49th Annual Technical Conference Proceedings (2006) ISSN 0737-5921, pp. 343-348.

V. Sittinger et al., "Position and Time Resolved Optical Emission Spectroscopy and Film Properties of ITO Films Deposited by High Power Pulsed Magnetron Sputtering" 2007 Society of Vacuum Coaters 505/856-7188, 50th Annual Technical Conference Proceedings (2007) ISSN 0737-5921, pp. 144-149.

V. Kouznetsov et al., "A novel pulsed magnetron sputter technique utilizing very high target power densities", Surface and Coatings Tecnology, 1999, vol. 122, pp. 290-293.

* cited by examiner

METHOD FOR PRODUCING A TRANSPARENT AND CONDUCTIVE METAL OXIDE LAYER BY HIGHLY IONIZED PULSED MAGNETRON SPUTTERING

BACKGROUND OF THE INVENTION

Field of the Invention

The present invention relates to a method for producing a transparent and conductive metal oxide layer on a substrate in which at least one component of the metal oxide layer is atomized by highly ionized pulsed magnetron sputtering and condenses on the substrate.

With the aid of physical vapor deposition methods (PVD), which are already known in numerous different method variants from the prior art, a substrate can be coated with a metal oxide layer, which may for example be transparent and conductive. In this case, at least one component of the layer material with which a surface of the substrate is to be coated is vaporized and subsequently condenses on the surface to be coated.

An important group of the aforementioned physical vapor deposition methods is formed by what are known as sputtering methods, in which the layer material is in the form of a solid-state target, which is atomized by ion bombardment and thereby transformed into the gas phase. A method that is often used for creating a metal oxide layer on a substrate is that known as magnetron sputtering, which has undergone a number of further developments in the past years. For example, high-power pulsed magnetron sputtering (HPPMS) represents a novel method for producing layers or layer systems with novel mechanical and chemical properties. In the case of such a method, the plasma is for example built up by periodic discharging of a bank of capacitors (see for example Christie D. J.: Journal of Vacuum Science and Technology A 23 (2005), pages 330-5). This is a pulsed sputtering method in which the power density at the target can reach approximately 30 to 100 times the values which are customary in conventional (DC) magnetron sputtering methods. For metallic sputtering processes, peak power densities greater than 1 kW/cm$^2$ are possible (see Anders A., Andersson J., Ehiasarian A., Journal of Applied Physics 102, 113303 (2007)). Under such process conditions, the magnetron discharge is operated at the transition to the arc discharge. This causes increased ionization of the sputtered target material.

In comparison with conventional DC sputtering methods, the HPPMS method briefly explained above is distinguished in particular by a high degree of ionization and by increased kinetic energy of the layer-forming particle stream as it impinges on the surface of the substrate to be coated. One result of this is that there is an increase in the mobility of the adsorbed particles on the surface of the substrate and another result is that there is likewise a strong increase in the energy inputs through the additional reflected neutral particles and through negative oxygen ions formed at the target, which likewise impinge on the layer. For the sputtering of metals, degrees of ionization of more than 80% have already been achieved, as compared to values of less than 1% for conventional continuous operation. When sputtering ceramic solid-state targets or metallic solid-state targets in the reactive gas process, however, it has so far only been possible to achieve relatively low power densities up to a maximum of 1.5 kW/cm$^2$ (see V. Sittinger, F. Ruske, W. Werner, C. Gerloff, B. Szyszka, D.J. Christie: SVC Annual Technical Conference Proceedings 49 (2006) 343; V. Sittinger, F. Ruske, B. Szyszka, D.J. Christie, T. Wallendorf: SVC Annual Technical Conference Proceedings 50 (2007)).

HPPMS methods for depositing metal oxide layers with peak power densities greater than 1.5 kW/cm$^2$ and pulses with durations of ≤200 μs are already known from the prior art (see: Anders et al.: J. Appl. Phys., Vol. 102 (1997), page 113303; Sproul et al.: Thin Solid Films, Vol. 491 (2005), pages 1-17 and DE 10 2006 021 994 A1). It is also already known from the first-mentioned publication that, depending on the target material and the voltage applied during the ignition of the plasma, high current densities can occur. This publication also provides evidence of the customary procedure in the prior art of using "arc handling" (arc discharge handling) to limit the currents produced.

One disadvantage of the transparent and conductive metal oxide layers produced by the methods known from the prior art is that they do not have sufficient mechanical or chemical stability or satisfactory optical properties for many practical applications.

BRIEF SUMMARY OF THE INVENTION

The present invention is based on the object of providing a method for producing a transparent and conductive metal oxide layer on a substrate by highly ionized pulsed high-power magnetron sputtering by means of which particularly advantageous layer properties of the metal oxide layer can be obtained—in particular with regard to the mechanical and chemical stability thereof. This object is achieved by a method according to the invention, as follows:

A method according to the invention for producing a metal oxide layer (or a metal oxide layer system) on a substrate by highly ionized pulsed high-power magnetron sputtering is distinguished by the pulses of the magnetron having a peak power density that is greater than 1.5 kW/cm$^2$, the pulses of the magnetron having a duration that is ≤200 μs, and the average increase in current density during ignition of the plasma within a time interval which is ≤0.025 ms being at least 106 A/(ms cm$^2$).

A magnetron in pulsed operation is used for carrying out the method, the pulses having a specific pulse duration and the average increase in current during ignition of the plasma being at least 106 A/(ms cm$^2$). In this case, a time interval of 0.025 ms is not exceeded. The peak power density—in relation to the sputtered surface area of the target—must in this case be greater than 1.5 kW/cm$^2$. The substrates which are coated with the transparent and conductive metal oxide layer may consist in particular of glass, plastic, metal or ceramic. For example, the transparent and conductive metal oxide layer may be an indium tin oxide layer which is applied to a glass substrate in order in this way to obtain a glass product with a low-emitting surface, which can be used for example for producing exterior glazing of a motor vehicle. As compared with the methods known from the prior art, in the case of the method according to the invention peak power densities that are greater than 1.5 kW/cm$^2$ per pulse are generated, to be precise with a comparable or even shorter pulse duration of the order of magnitude of approximately 200 μs and below. It has been found that the properties of the metal oxide layers can be optimized decisively for different applications, in particular by the steeper increase in current. It has been found that the pulse and power parameters are decisive for creating a layer structure with particularly advantageous mechanical and chemical properties. For instance, the morphology and texture of the metal oxide layer and the resultant layer properties can be influenced extremely by deliberate adaptation/alteration of the parameters of the generator.

In comparison with conventional DC magnetron sputtering methods known from the prior art and the ionizing methods used so far, the method according to the invention leads to increased kinetic energy and a higher degree of ionization of the species contributing to the layer formation on the substrate surface that are decisive for example for obtaining a mechanically stable metal oxide layer on a glass substrate by a toughened safety glass or laminated safety glass process (TSG process or LSG process for short) following the application of the layer. The texture and morphology that can be set by the method according to the invention allow the metal oxide layer to achieve the properties required in the subsequently carried out tempering step (TSG/LSG process) and withstand a bending process without being damaged.

There is, particularly advantageously, the possibility of being able to dispense with any kind of arc discharge detection or arc discharge handling. In the case of the existing types of generator that have been used for the HPPMS methods, "arc handling" (arc discharge handling), which for example limits the increase in current by a threshold switch, has been provided on account of the overloading of the components. This is no longer necessary in the case of the method presented here, since switching off of the generator can take place automatically by presetting the length of the pulse duration. This allows, particularly advantageously, the use of much more favorable generators than has so far been the case.

It may be provided in a particularly preferred embodiment that the pulses of the magnetron have a peak power density that is at least 3.0 kW/cm$^2$.

In a particularly advantageous embodiment, there is the possibility that the pulses of the magnetron have a duration that is ≤100 µs. In a particularly advantageous embodiment, it is proposed that the pulses of the magnetron have a duration that is ≤50 µs, preferably ≤40 µs, in particular ≤35 µs. It has been found that pulses that are as short as possible can have positive effects on the properties of the metal oxide layer.

The pulses of the magnetron may advantageously have a frequency that is at least 100 Hz. In a particularly preferred embodiment, the pulses may have a frequency between 350 Hz and 2 kHz.

It may be provided in a particularly advantageous embodiment that a ceramic target is atomized for the creation of the transparent and conductive metal oxide layer. In an alternative advantageous embodiment, there is the possibility that a metallic target is atomized in the reactive gas process with the addition of oxygen for the creation of the transparent and conductive metal oxide layer.

In a preferred embodiment, it is proposed that the temperature at which the substrate is coated with the metal oxide is less than 100° C. Preferably, the substrate is coated with the metal oxide at room temperature. Using the highly ionized coating method presented here at room temperature or at temperatures lower than 100° C. allows novel and significantly improved layer properties to be achieved as compared with the existing layers created with conventional PVD and ionizing PVD methods. These improved properties are manifested for example by a higher mechanical stability of the metal oxide layer. In the case of the methods known from the prior art, a preferred orientation of the growing crystallites is also obtained with a coating of the substrate at room temperature. In comparison, by means of the method presented here, finely crystalline metal oxide layers can be created on the substrate surface with structural properties that correspond to those of a metal oxide powder. Consequently, for example, a glass product having a glass substrate on which a transparent and conductive metal oxide layer (for example an indium tin oxide layer) has been applied by the method described here is suitable for exterior glazing of a motor vehicle or for other applications in which the coating is exposed to high mechanical and/or chemical loading.

It is provided in a particularly advantageous embodiment that the metal oxide layer is created with a finely crystalline structure of which the lateral and vertical grain sizes are less than 35 nm.

In a further advantageous embodiment there is the possibility that the substrate with the metal oxide layer applied to it is tempered in a further method step. The tempering process may be, in particular, the TSG/LSG tempering process, in which process temperatures of approximately 650° C. can be reached. Preferably, the metal oxide layer substantially retains its crystallinity and the crystallite size after the tempering step. Preferably, the change in crystallite size after the tempering step both laterally and vertically is less than 30%, preferably less than 20%, in particular less than 10%.

It has been found for example that an indium tin oxide layer with a thickness of 140 nm (or a multiple of this thickness on account of interference phenomena), with which it has particularly high transparency in the visible spectral range (about 380 nm to 780 nm), has after a TSG/LSG tempering process and/or bending process good conductivity (<300 µΩcm) with at the same time high transmission (>75% on 2 mm float glass) and likewise high mechanical and chemical stability.

BRIEF DESCRIPTION OF THE SEVERAL VIEWS OF THE DRAWING

Further features and advantages of the present invention become clear from the following description of preferred exemplary embodiments with reference to the accompanying figures, in which.

DESCRIPTION OF THE INVENTION

Figure 1:
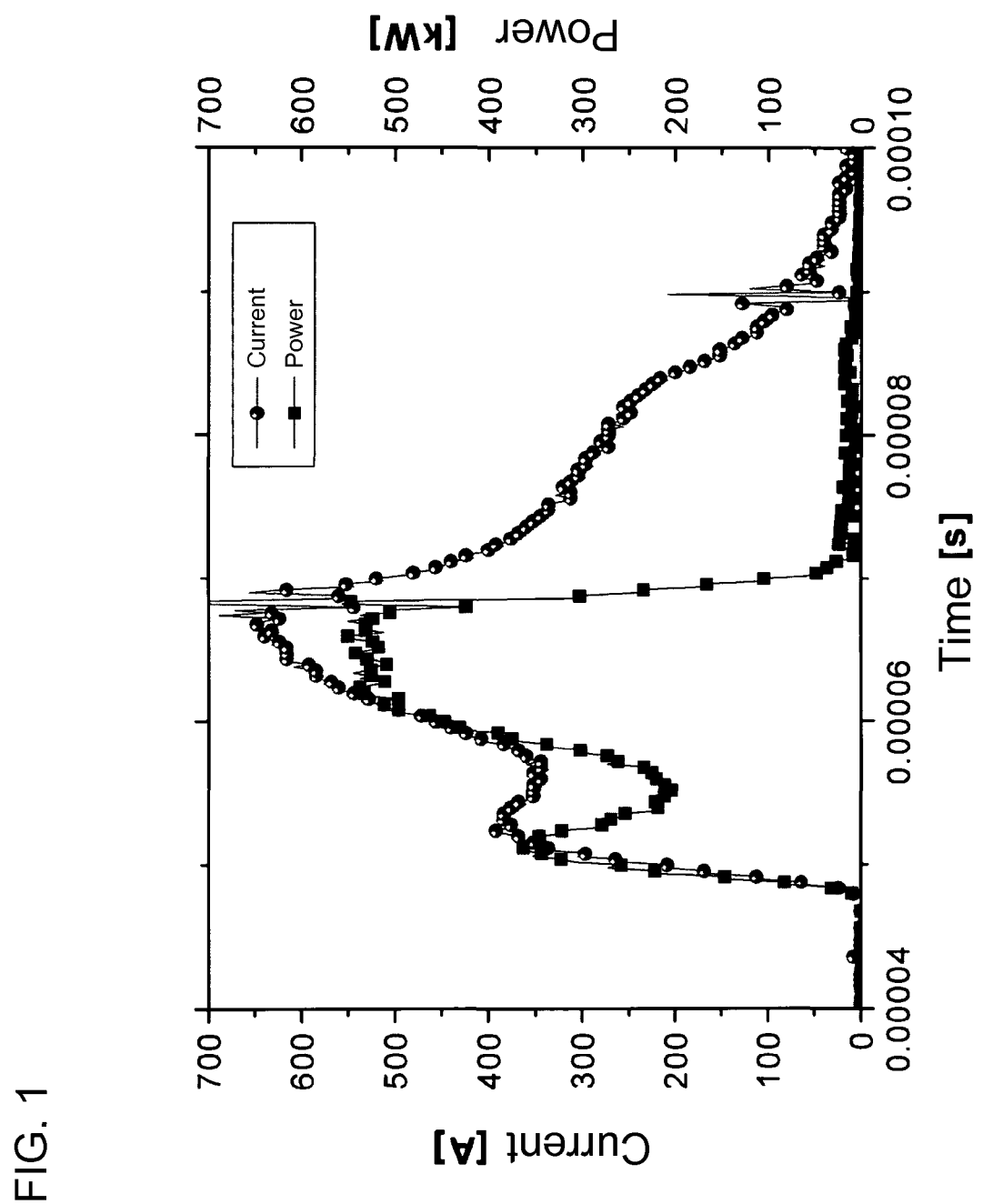
FIG. 1 shows the variation over time of a current and power pulse of an inductively coupled magnetron for generating HPPMS pulses, which are used for producing a metal oxide layer on a substrate.

Reference is firstly made to FIG. 1, which shows a possible pulse pattern of an inductively coupled system for generating high-power pulsed magnetron sputtering pulses (HPPMS pulses for short), which are used for producing a transparent and conductive metal oxide layer on a substrate. The pulse patterns shown here are determined by the type of generator used, which performs the coupling-in inductively. In principle, other variations in current or power are also possible. Of particular importance for the properties of the metal oxide layer is the increase in current achieved within a limited time period. In the exemplary embodiment shown here, a conventional magnetron with a magnetic field of 30 mT was used on the target surface. The increase in current is in this case dependent on the magnetic field strength and can be increased significantly by increasing the magnetic field strength.

In comparison with conventional DC magnetron sputtering methods and the ionizing methods used so far, the high-power magnetron sputtering method presented here leads to increased kinetic energy and a higher degree of ionization of the elements contributing to the layer formation that are decisive for example for obtaining a mechanically stable metal oxide layer on a glass substrate by a toughened safety glass or laminated safety glass tempering step following the layer formation.

The method for producing the transparent and conductive metal oxide layer on the substrate is generally distinguished by the pulses of the magnetron having a peak power density that is greater than 1.5 kW/cm$^2$, the pulses of the magnetron having a duration that is ≤200 μs, and the average increase in current density during ignition of the plasma within a time interval which is ≤0.025 ms being at least 106 A/(ms cm$^2$).

The substrates which are coated with the transparent and conductive metal oxide layer may consist in particular of glass, plastic, metal or ceramic.

For the production of the metal oxide layer there may be used, for example, a ceramic solid-state target, which is atomized with the aid of the high-power magnetron sputtering method. Alternatively, there is also the possibility that a metallic solid-state target is used in a reactive gas process with the addition of oxygen for the production of the metal oxide layer.

Figure 2:
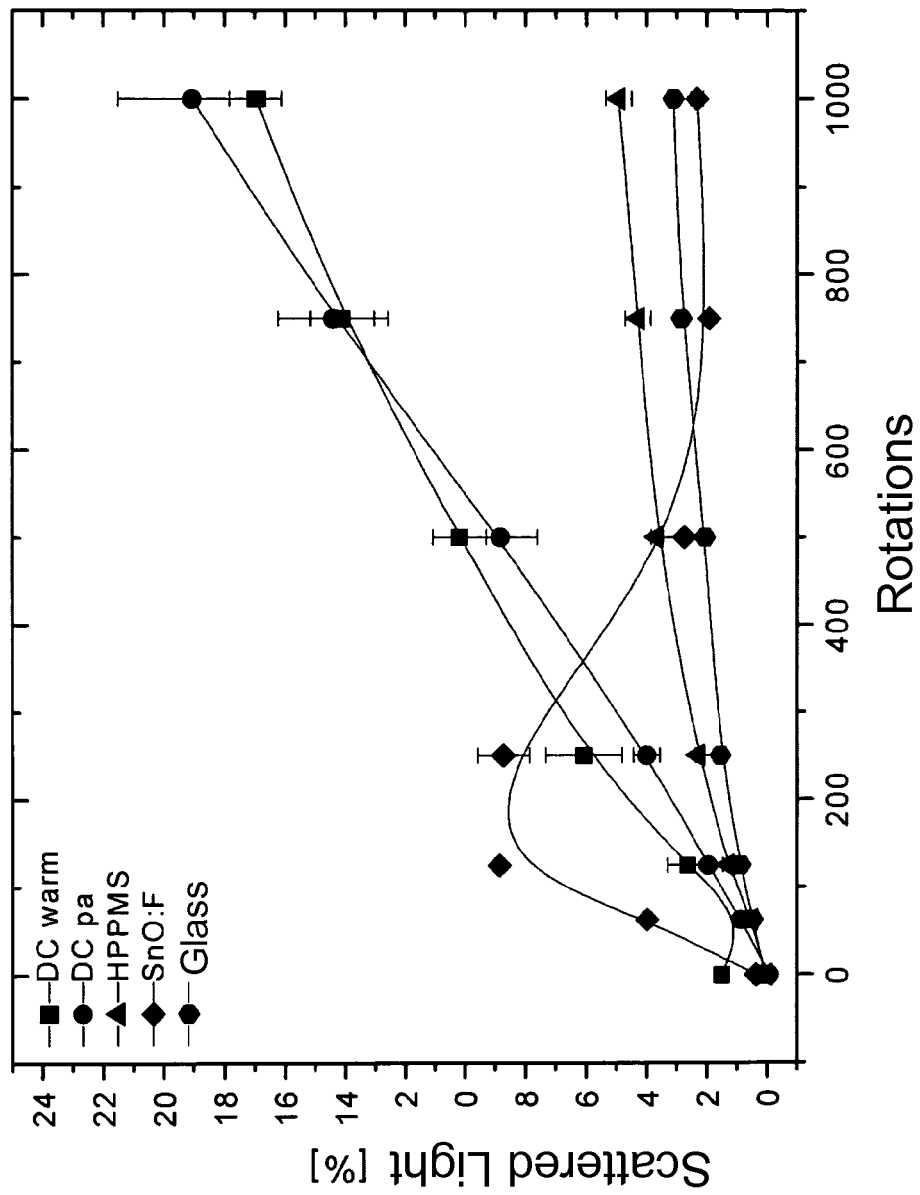
FIG. 2 shows the results of abrasion tests on various specimens in dependence on the rotations of a turntable of an abrasion tester in accordance with DIN 52 347 (1987).

To illustrate the advantageous properties of the transparent and conductive metal oxide layers on a glass substrate that are produced by means of the method presented here, reference is made hereafter to FIG. 2, which shows a comparison of the "haze" measurements of various specimens.

The measurement results provide information on the abrasion of the specimens after specific mechanical loading. The abrasion tests were performed by means of an abrasion wheel method with scattered light measurement in accordance with DIN 52 347 (1987). This test method is often also referred to as the "Taber test". As explained in more detail in DIN 52 347 (1987), the specimens are subjected to sliding abrasion on a turntable of the abrasion tester by two abrasion wheels rotating in opposite directions. The measured variable for the degree of abrasion of the specimens is the proportion of the transmitted light that is turned into scattered light by changes in the surface and leads to hazing of the specimens.

FIG. 2 shows the results of abrasion tests on the following specimens:
conventional glass,
a glass substrate with an SnO:F coating,
a glass substrate with an indium tin oxide layer which has been applied to the substrate by a conventional DC sputtering method at room temperature and subsequently tempered (referred to in FIG. 2 as "DC pa"),
a glass substrate with an indium tin oxide layer which has been applied to the substrate by a conventional DC sputtering method at T=300° C. (referred to in FIG. 2 as "DC warm") and
a glass substrate with an indium tin oxide layer which has been applied to the glass substrate by a high-power magnetron sputtering method with the method parameters disclosed within this application and subsequently tempered (referred to in FIG. 2 as "HPPMS").

The integral light scattering, which is a measure of the haze of the specimens, is plotted against the number of rotations of the turntable of the abrasion test. The greater the percentage of scattered light, the greater the haze of the respective specimen.

The results show that the metal oxide layer produced with the aid of the high-power magnetron sputtering method presented here has particularly advantageous mechanical and optical properties.

With an increasing number of rotations of the turntable of the abrasion tester, the uncoated glass specimen shows an increase in the proportion of scattered light to approximately 3% (after 1000 rotations). The glass substrate with the SnO:F coating shows the highest increase in the proportion of scattered light within the first 200 rotations to over 8%, and consequently also the greatest haze in this range. If the number of rotations is increased further, the proportion of scattered light approaches the measured value of the proportion of scattered light of the uncoated glass specimen after only 500 rotations. This can be explained by an abrasion of the SnO:F coating from the surface of the glass substrate.

The two glass substrates coated with the indium tin oxide layer by means of the conventional DC sputtering method show a proportion of scattered light which increases strongly along with the number of rotations, and consequently strongly increased haze. It is noticeable that the haze of the specimen produced at T=300° C. is initially greater than the haze of the specimen produced at room temperature. After 700 rotations, the proportion of scattered light is virtually identical in the case of both specimens at approximately 14%. After 1000 rotations, the proportion of scattered light of the glass substrate coated at room temperature exceeds the proportion of scattered light of the specimen produced at T=300° C. After 1000 rotations, both specimens show a strongly increased proportion of scattered light, which in each case is greater than 16%.

In comparison with the specimens mentioned above, the glass substrate which has been coated with an indium tin oxide layer by high-power magnetron sputtering methods described here shows considerably better mechanical and optical properties, which are manifested by a proportion of scattered light which, though increasing with an increasing number of rotations of the turntable of the tester, is still less than 5% even after 1000 rotations. The proportion of scattered light in the case of this specimen is consequently less than one third of the proportion of scattered light of the specimens produced by means of the conventional DC sputtering method.

To sum up, it is clear that the transparent and conductive metal oxide layers produced with the aid of the method presented here differ quite considerably with regard to their stability and their optical properties from the coatings produced by the conventional methods. It has for example been found that an indium tin oxide layer with a thickness of 140 nm, with which it has particularly high transparency, has after a TSG/LSG tempering process and/or bending process good conductivity (<300 μΩcm) with at the same time high transmission and likewise high mechanical and chemical stability. Consequently, a glass product which has a glass substrate with such an indium tin oxide layer is suitable for example for producing low-emitting exterior glazing of a motor vehicle.

The invention claimed is:

1. A method for producing a transparent and conductive metal oxide layer on a substrate, the method comprising the following steps:
    atomizing at least one component of the metal oxide layer by highly ionized pulsed high-power magnetron sputtering and condensing the at least one component on the substrate;
    providing the pulses of the magnetron with a peak power density of greater than 1.5 kW/cm$^2$;
    providing the pulses of the magnetron with a duration of ≤200 μs; and
    providing an average increase in current density during ignition of the plasma of at least 106 A/(ms cm$^2$) within a time interval of ≤0.025 ms.

2. The method according to claim 1, which further comprises providing the pulses of the magnetron with a peak power density of at least 3.0 kW/cm².

3. The method according to claim 1, which further comprises providing the pulses of the magnetron with a duration of ≤100 µs.

4. The method according to claim 1, which further comprises providing the pulses of the magnetron with a duration of ≤50 µs.

5. The method according to claim 1, which further comprises providing the pulses of the magnetron with a duration of ≤40 µs.

6. The method according to claim 1, which further comprises providing the pulses of the magnetron with a duration of ≤35 µs.

7. The method according to claim 1, which further comprises providing the pulses of the magnetron with a frequency of at least 100 Hz.

8. The method according to claim 1, which further comprises providing the pulses of the magnetron with a frequency between 350 Hz and 2 kHz.

9. The method according to claim 1, which further comprises atomizing a ceramic target for creating the metal oxide layer.

10. The method according to claim 1, which further comprises atomizing a metallic target in a reactive gas process with an addition of oxygen for creating the metal oxide layer.

11. The method according to claim 1, which further comprises coating the substrate with the metal oxide at a temperature of less than 100° C.

12. The method according to claim 1, which further comprises creating the metal oxide layer with a finely crystalline structure having lateral and vertical grain sizes of less than 35 nm.

13. The method according to claim 1, which further comprises tempering the substrate with the metal oxide layer in a further method step.

14. The method according to claim 13, which further comprises substantially retaining a crystallinity and a crystallite size of the metal oxide layer after the tempering step.

15. The method according to claim 13, which further comprises limiting a change in crystallite size after the tempering step, both laterally and horizontally, to less than 30%.

16. The method according to claim 13, which further comprises limiting a change in crystallite size after the tempering step, both laterally and horizontally, to less than 20%.

17. The method according to claim 13, which further comprises limiting a change in crystallite size after the tempering step, both laterally and horizontally, to less than 10%.

18. The method according to claim 1, which further comprises operating the magnetron without arc discharge handling.

* * * * *